(12) United States Patent
Choi et al.

(10) Patent No.: US 6,330,187 B1
(45) Date of Patent: Dec. 11, 2001

(54) NONVOLATILE MEMORY DEVICE AND METHOD FOR MANUFACTURING THE SAME

(75) Inventors: Jeong-hyuk Choi, Suwon; Jong-han Kim, Sungnam, both of (KR)

(73) Assignee: Samsung Electronics, Co., Ltd. (JP)

( * ) Notice: Subject to any disclaimer, the term of this patent is extended or adjusted under 35 U.S.C. 154(b) by 0 days.

(21) Appl. No.: 09/437,801

(22) Filed: Nov. 10, 1999

(30) Foreign Application Priority Data

Nov. 13, 1998 (KR) .................................................. 98-48655

(51) Int. Cl.$^7$ .................................................. G11C 16/04
(52) U.S. Cl. .................. 365/185.15; 365/185.05; 257/336; 257/398
(58) Field of Search ................... 365/185.15, 185.14, 365/185.18, 185.29, 185.05; 257/336, 337, 398

(56) References Cited

U.S. PATENT DOCUMENTS

| | | | |
|---|---|---|---|
| 4,652,897 | 3/1987 | Okuyama et al. | 365/168 |
| 5,057,884 | * 10/1991 | Suzuki et al. | 257/23.4 |
| 5,073,519 | * 12/1991 | Rodder | 437/180 |
| 5,482,880 | * 1/1996 | Kaya et al. | 437/43 |
| 5,719,423 | * 2/1998 | Todd et al. | 257/336 |

OTHER PUBLICATIONS

A Single Transistor EEPROM Cell And Its Implementation In A 512L CMOS EEPROM, IEDM Tech. Digest, pp 616–619, 1985.

* cited by examiner

*Primary Examiner*—Son T. Dinh
(74) *Attorney, Agent, or Firm*—Cantor Colburn LLP

(57) ABSTRACT

A nonvolatile memory device having a lightly doped source and a method for manufacturing the same are provided. In the nonvolatile memory device, a first insulating layer, a floating gate, a second insulating layer and a control gate are sequentially formed on a semiconductor substrate, and a drain, a lightly doped source and a highly doped source are formed around a surface of the semiconductor substrate. At this time, the highly doped source is shallower than the drain without being overlapped by the floating gate. Thus, the integration of the memory cell can be increased, and the trapping of electrons is reduced in the first insulating layer formed between the floating gate and the lightly doped source, to thereby enhance the characteristics of the memory cell.

17 Claims, 5 Drawing Sheets

NONVOLATILE MEMORY DEVICE AND METHOD FOR MANUFACTURING THE SAME

BACKGROUND OF THE INVENTION

1. Field of the Invention

The present invention relates to a memory device and a method for manufacturing the same, and more particularly, to a flash memory device having a lightly doped source and a method for manufacturing the same.

2. Description of the Related Art

A typical structure of arranging nonvolatile memory cells is disclosed in "A SINGLE TRANSISTOR EPROM CELL AND ITS IMPLEMENTATION IN A 512K CMOS EEPROM", IDEM pp 616–619, 1985. FIG. 1 is a sectional view of a conventional nonvolatile Erasable and Programmable Read Only Memory (EPROM) type NOR flash memory cell. Referring to FIG. 1, a first insulating layer 330, a floating gate 340, a second insulating layer 350 and a control gate 360 are sequentially formed on a semiconductor substrate 300. Also, a drain 310 and sources 320 and 322 are formed in a predetermined region under the surface of the semiconductor substrate 300. The source comprises a highly doped region 320 and a lightly doped region 322 surrounding the highly doped region 320. The lightly doped region 322 and the highly doped region 320 are partially overlapped by the floating gate 340. Also, the drain 310 is doped with a high concentration impurity, and the drain 310 is partially overlapped by the floating gate 340. The first insulating layer 330 is formed of a tunnel oxide layer in which electrons can be tunneled.

Operation of an EPROM type NOR flash memory cell will be described below. The EPROM type NOR flash memory cell has programming, erasing and reading operations. When a high voltage is applied to a bit line connected to the drain 310 and to a word line connected to the control gate 360 to program a cell, hot electrons are generated at the drain junction. The hot electrons pass through the first insulating layer 330 and then are injected into the floating gate 340 arid thus the hot electrons are stored in the floating gate 340. Accordingly, the threshold voltage of a device is increased, so that the device is programmed. The electrons stored in the floating gate 340 must be removed to erase the programmed device. When a high voltage is applied to the source, the electrons stored in the floating gate move to the source in a Fowler-Nordheim (F-N) tunneling manner to be erased from the floating gate 340.

Accordingly, the program operation of a nonvolatile memory device is performed by electron injection in the drain 310. Here, the electrons injected into the floating gate 340 are partially trapped by the first insulating layer 330. Characteristics of the first insulating layer 330 are deteriorated by the trapped electrons. Also, the erasing operation of the device is performed through the source. Here, the tunneled electrons are trapped by the first insulating layer 330 formed between the floating gate 340 and the sources 322 and 320, and thereby deteriorate the characteristics of the device.

The size of a cell is reduced to realize high-integration of a nonvolatile memory device. However, the drain 310 requires a depletion region for generating hot-carriers under the floating gate 340, so that the drain 310 and the floating gate 340 must overlap each other. Also, in order to lower the applied voltage during the erase operation, the highly doped source must partially overlap the floating gate 340 to directly tunnel the carriers. Also, in order to prevent the generation of the breakdown in the highly doped source 320 by the applied voltage during the erase operation, a lightly doped source 322 must surround the highly doped source 320. Moreover, an effective channel length between the source and the drain 310 under the floating gate 340 is required, so that the channel is capable of operating as a memory device, as well as in a region where the source and the drain 310 overlap the floating gate 340. Therefore, the integration of the nonvolatile memory device is reduced.

FIG. 2 is a sectional view of a memory cell in which a highly doped source 320 and a floating gate 340 overlap each other. Reference numeral 324 indicates a depletion region formed in a junction region of the lightly doped source 322 and the semiconductor substrate 300 when a voltage is applied to the source for the erase operation. Here, electrons stored in the floating gate 340 tunnel to the source as indicated by the arrows. Thus, in a memory cell in which the highly doped source 320 and the floating gate 340 overlap with each other, a low voltage is applied to the source to cause electron tunneling. If the highly doped source 320 does not overlap with the floating gate 340, electrons stored in the floating gate 340 tunnel through the depletion region to the highly doped source 320. Thus, in a memory cell in which the highly doped source 320 and the floating gate 340 do not overlap with each other, a high voltage must be applied to the highly doped source to cause electron tunneling. It is preferable that the highly doped source 320 and the floating gate 340 overlap with each other to lower the applied voltage during the erase operation. Thus, in a memory cell in which the electrons stored in the gate are erased in the F-N tunneling manner, each of the highly doped source 320 and drain 310 must overlap with the floating gate 340, so that it is difficult to increase the integration of the nonvolatile memory device.

An EPROM having a lightly doped source is disclosed in U.S. Pat. No. 4,652,897. The structure of a device disclosed in the U.S. Pat. No. 4,652,897 will be described with reference to FIGS. 3 and 4. Referring to FIG. 3, a first insulating layer 510, a floating gate 340, a second insulating layer 350 and a control gate 360 are sequentially stacked on a semiconductor substrate 300. Also, a drain 310, a lightly doped source 502 and a highly doped source 500 are formed around the surface of the semiconductor substrate 300. Here, the impurity concentration of the lightly doped source is $1 \times 10^{16} \sim 1 \times 10^{17}$ atoms/cm$^3$, and the length W1 along the gate of FIG. 3 is 0.3~0.4 $\mu$m. The drain 310 and the lightly doped source 502 are overlapped by the floating gate 340. The first insulating layer 510 is a gate oxide layer.

FIG. 4 is a graph showing the electric field intensity b1 and potential a1 in a cell during programming of a memory cell. Referring to FIG. 4, it can be shown that the electric field intensity b1 is increased in the lightly doped source 502 having a high resistance. Thus, in the memory cell of FIG. 3, hot-carriers generated in the lightly doped source 502 are then injected into the floating gate 340, to thereby program the memory cell. Also, in the memory cell of FIG. 3, an electric erase operation cannot be performed and thus the electrons stored in the floating gate 340 are erased by exposing them to ultra-violet light.

FIG. 5 is a sectional view of a memory cell in which electrons stored in the floating gate 340 can be electrically erased through a source. Referring to FIG. 5, a gate oxide layer 512 and a tunnel oxide layer 514 are formed instead of the first insulating layer 330 of FIG. 3. Thus, the program operation is the same as that of the memory cell disclosed in FIG. 3, but the erase operation is electrically performed through the source. That is, when a high voltage is applied to the highly doped source 500 in an erase operation, the electrons stored in the floating gate 340 move across the tunnel oxide layer 514 by tunneling.

However, in the memory cell disclosed in FIG. 5, the highly doped source 500 and the floating gate 340 do not overlap with each other. Thus, in order to cause tunneling of the electrons stored in the floating gate 340, a relatively high voltage must be applied to the highly doped source 500 considering the resistance and the depletion region in the lightly doped source 502, so that the memory cell has operational requirements which are difficult to meet. Also, a high electric field is applied to the lightly doped source 502 during the erase operation, so that many hot carriers are generated in the lightly doped source 502 and thus the number of traps between the tunnel oxide layer 514 and the lightly doped source 502 are increased. Thus, resistance of the memory cell is increased, so that characteristics of the memory cell are changed.

SUMMARY OF THE INVENTION

To solve the above problems, it is an objective of the present invention to provide a nonvolatile memory device in which electrons stored in a floating gate are electrically discharged to a semiconductor substrate, to thereby suppress deterioration of the characteristics of a first insulating layer due to electrons trapped in the first insulating layer, and highly doped source has a reduced depth, to thereby enhance the integration of the memory cell.

It is another objective of the present invention to provide a method for manufacturing a nonvolatile memory device.

Accordingly, to achieve the first objective, there is provided a nonvolatile memory device comprising: a semiconductor substrate of a first conductivity type; a first insulating layer, a floating gate, a second insulating layer and a control gate sequentially stacked on the semiconductor substrate; a highly doped source of a second conductivity type formed around the surface of the semiconductor substrate, spaced away from the sidewall of the floating gate; a lightly doped source of the second conductivity type formed around the surface of the semiconductor substrate, connected to the highly doped source, overlapped by the floating gate, having an impurity concentration lower than that of the highly doped source; and a drain of a second conductivity type formed around the surface of the semiconductor substrate, overlapped by the floating gate, deeper than the highly doped source, having an impurity concentration same as that of the highly doped source.

It is preferable that the lightly doped source has an impurity concentration of $5\times10^{17}$~$5\times10^{18}$ atoms/cm$^3$ and the lightly doped source has a length of 0.2 $\mu$m or less in the direction of the floating gate from an edge of the highly doped source. A programming operation of the nonvolatile memory device is performed by generating hot carriers in a depletion region of the drain, when a voltage is applied to the drain and the control gate, and injecting part of the generated hot carriers into the floating gate from a region where the drain region and the floating gate overlap with each other so that the hot carriers are stored in the floating gate, and erase operation of the nonvolatile memory device is performed by tunneling the electrons stored in the floating gate by the program operation into the semiconductor substrate, when a voltage is applied to the semiconductor substrate.

Also, a nonvolatile memory device having a cell region and a peripheral circuit region formed on a semiconductor substrate of a first conductivity type, comprises: a first insulating layer, a floating gate, a second insulating layer and a control gate which are sequentially formed on the semiconductor substrate of the cell region; a highly doped source of a second conductivity type formed around the cell region surface of the semiconductor substrate, and spaced apart from the side wall of the floating gate; a lightly doped source of the second conductivity type formed around the cell region surface of the semiconductor substrate, connected to the highly doped source, overlapped by the floating gate, and having an impurity concentration lower than that of the highly doped source; a drain of a second conductivity type formed around the cell region surface of the semiconductor substrate, overlapped by the floating gate, having the same impurity concentration as that of the highly doped source; and a MOS transistor formed in the peripheral circuit region, having the structure of a lightly doped drain. Here, preferably, the impurity concentration of the lightly doped source in the cell region is higher than that of the lightly doped drain of the MOS transistor in the peripheral circuit region.

It is also preferable that the depth of the drain in the cell region is deeper than that of the highly doped source in the cell region.

To achieve the second objective, there is provided a method for manufacturing a nonvolatile memory device comprising: (a) forming a stacked gate where a first insulating layer, a floating gate, a second insulating layer and a control gate are stacked in a cell region of a semiconductor substrate having a cell region and a peripheral circuit region; (b) implanting an impurity and diffusing the impurity to form a drain overlapped by part of the stacked gate; (c) implanting an impurity with a dose lower than that of the drain to form a lightly doped source overlapped by part of the stacked gate; (d) forming a spacer on the sidewall of the stacked gate; (e) forming a photoresist layer pattern on the drain; (f) performing implantation into the lightly doped source using the stacked gate, the spacer and the photoresist layer pattern as a mask to form a highly doped source connected to the lightly doped source, without being overlapped by the stacked gate, having a depth lower than that of the drain.

Preferably, in implanting the impurity and difussing the impurity to form the drain, the implantation is performed with a dose of $2\times10^{15}$~$6\times10^{15}$ ions/cm$^2$. The implantation of an impurity with a dose lower than that of the drain to the form the lightly doped source preferably comprises forming a photoresist layer pattern exposing the source of the cell region; implanting an impurity using the photoresist layer pattern as a mask; and implanting an impurity into the entire surface of the semiconductor substrate after removing the photoresist layer pattern. Here, preferably, the implanting of an impurity using the photoresist layer pattern as a mask is performed with a dose of $3\times10^{13}$~$6\times10^{13}$ ions/cm$^2$, and the implanting of an impurity into the entire surface of the semiconductor substrate is performed with a dose of $1\times10^{13}$~$3\times10^{13}$ ions/cm$^2$. It is also preferable that a lightly doped source and drain of a MOS transistor is formed on the peripheral circuit region of the semiconductor substrate during the implanting of an impurity into the entire surface of the semiconductor substrate. Also, in the forming of the highly doped source region, the implantation is performed with a dose of $2\times10^{15}$~$6\times10^{15}$ ions/cm$^2$. Preferably, a lightly doped drain of a MOS transistor is formed on the peripheral circuit region of the semiconductor substrate during the implanting of an impurity into the entire surface of the semiconductor substrate. Also, the lightly doped source and drain of the MOS transistor in the peripheral circuit region of the semiconductor substrate are formed with an impurity concentration lower than that of the lightly doped source of the cell region. It is also preferable that the highly doped source of the cell region and the highly doped source and drain in the peripheral circuit region of the semiconductor substrate is formed to have a depth lower than that of the drain of the cell region. The nonvolatile memory device is a flash memory device.

According to the present invention, the depth of the highly doped source is reduced and the floating gate and the highly doped source are not overlapped, thereby increasing the integration of the memory cell. Also, electrons stored in the floating gate are tunneled to the semiconductor substrate during an erase operation of the memory cell, so that electron trapping in the first insulating layer formed between the lightly doped source and the floating gate can be prevented, to thereby achieve stable operation characteristics for the memory device.

BRIEF DESCRIPTION OF THE DRAWINGS

The above objectives and advantages of the present invention will become more apparent by describing in detail a preferred embodiment thereof with reference to the attached drawings in which.

DESCRIPTION OF THE PREFERRED EMBODIMENTS

Figure 1:
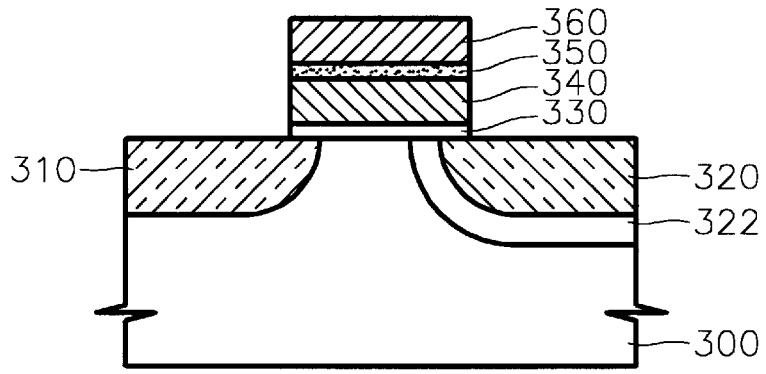
FIG. 1 is a sectional view of a conventional nonvolatile memory cell.
Figure 2:
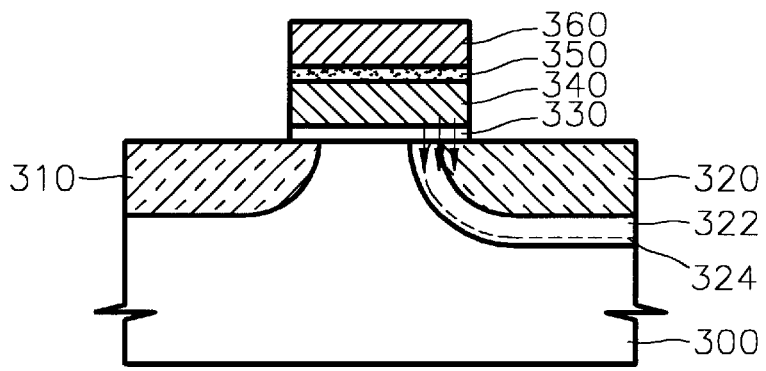
FIG. 2 is a sectional view of a point where the electrons stored in a floating gate are erased during an erase operation in a conventional nonvolatile memory device.

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like numbers refer to like elements throughout.

Embodiment of a Nonvolatile Memory Device

Figure 3:
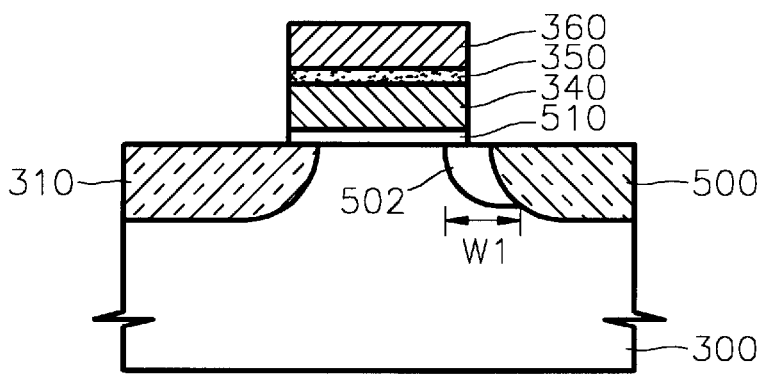
FIG. 3 is a sectional view of another nonvolatile memory device.
Figure 6:
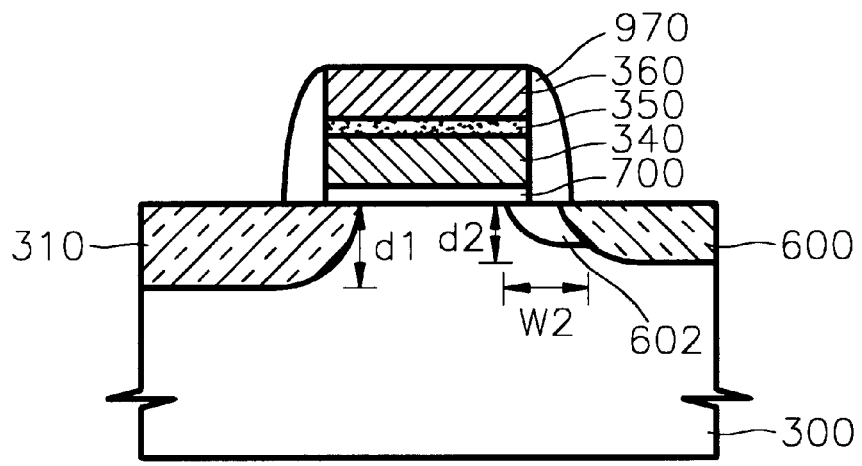
FIG. 6 is a sectional view of a nonvolatile memory device according to the present invention.

The structure of a nonvolatile memory device according to the present invention will be described with reference to FIG. 6. A first insulating layer 700, a floating gate 340, a second insulating layer 350, and a control gate 360 are sequentially formed on a p-type semiconductor substrate 300. A sidewall spacer 970 is formed on the sidewall of the first insulating layer 700, the floating gate 340, a second insulating layer 350 and a control gate 360. Also, a drain 310, a lightly doped source 602 and a highly doped source 600 are formed on the surface of the semiconductor substrate 300. Preferably, the first insulating layer 700 is a tunnel oxide layer in which a carrier can tunnel, and has the thickness of 70~100 Å. Preferably, the second insulating layer 350 has the structure of an oxide/nitride/oxide (ONO) layer. It is also preferable that the lightly doped source 602 has an impurity concentration of $5\times10^{17}$~$5\times10^{18}$ atoms/cm$^3$, and the length of the lightly doped source in the gate direction indicated by W2 of FIG. 6 is 0.2 μm or less. Thus, the length W2 of the lightly doped source 602 in FIG. 6, according to the present invention, is shorter than the length W1 in FIG. 3 of the conventional lightly doped source, and the impurity concentration of the lightly doped source 602 according to the present invention is higher than that of the conventional lightly doped source 502.

Also, the length of the lightly doped source region 602 is shorter than that of the conventional art and the impurity concentration is higher than that of the conventional art, so that resistance and electric potential in the lightly doped source 602 and the highly doped source 600 of this invention are similar to those in a corresponding region of the memory cell formed of only a highly doped source.

Preferably, the impurity concentration of the highly doped source 600 is higher than that of the lightly doped source 602, and the impurity concentration of the drain 310 is the same as that of the highly doped source 600. The highly doped source 600 is spaced away from the sidewall of the floating gate 340. However, the lightly doped source 602 is connected to the highly doped source 600, and the lightly doped source 602 is partially overlapped by the floating gate 340. Also, the drain 310 is partially overlapped by the floating gate 340. The depth d2 in FIG. 6 of the highly doped source 600 is shallower than the depth d1 in FIG. 6 of the drain 310, so that lateral diffusion can be reduced. Thus, the source of the memory cell according to the present invention has been reduced in area without influencing the operation of the memory cell, so that the integration of the memory cell can be enhanced. Preferably, the nonvolatile memory device according to the present invention is a flash memory device.

Figure 4:
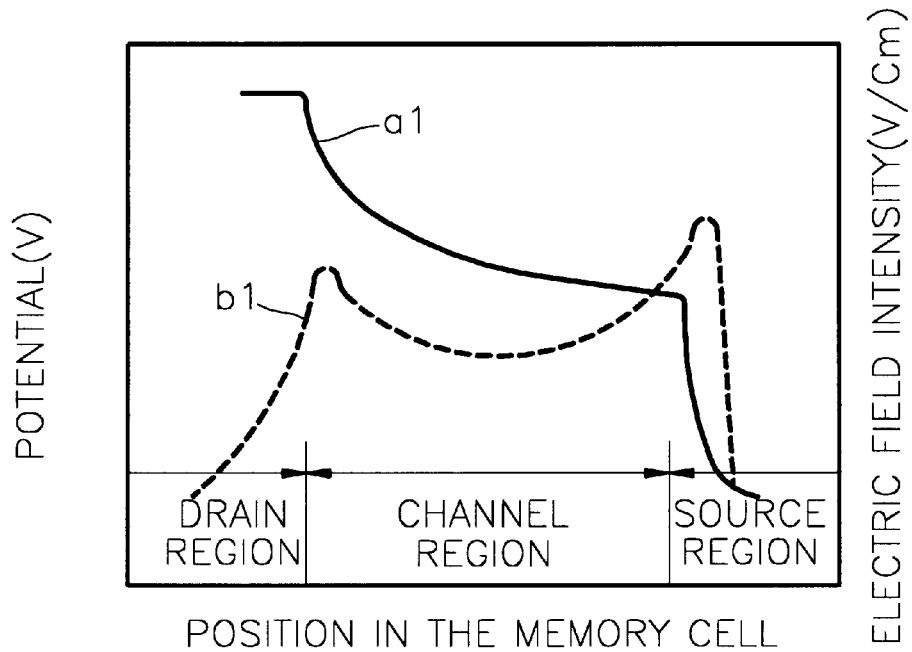
FIG. 4 is a graph showing electric field intensity and electric potential in a cell during programming of a memory cell of the nonvolatile memory device of FIG. 3.
Figure 5:
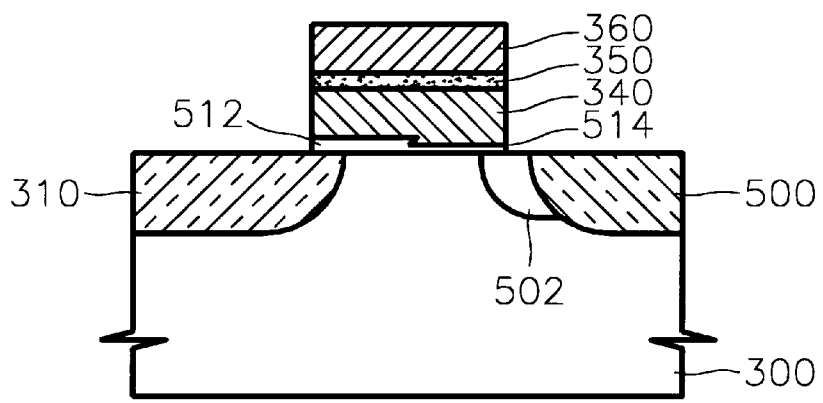
FIG. 5 is a sectional view of still another nonvolatile memory device.
Figure 7:
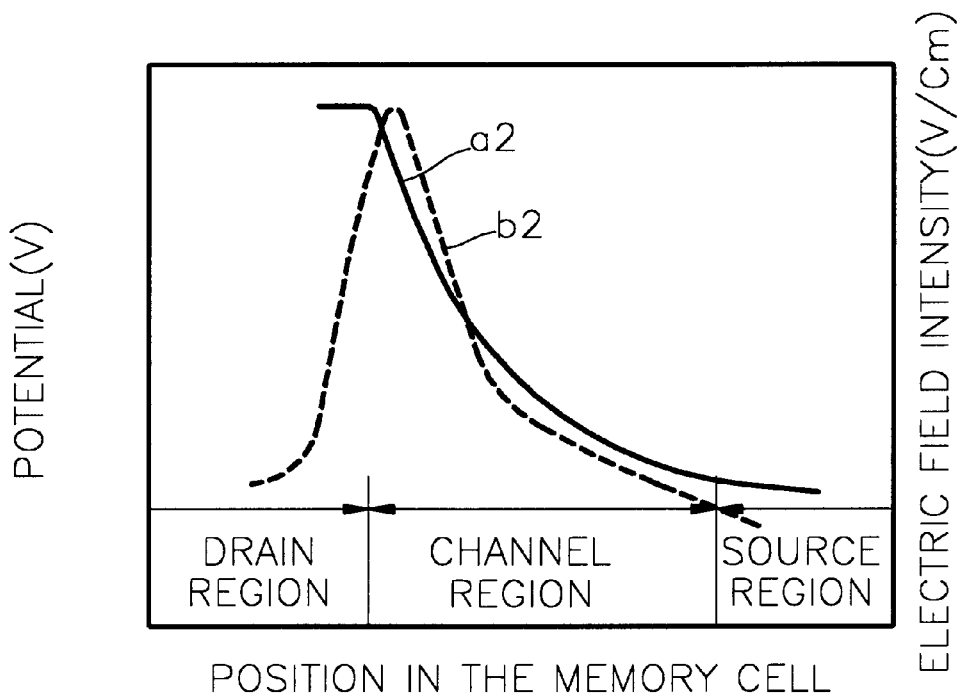
FIG. 7 is a graph showing electric field intensity and electric potential in a cell during programming of a memory cell of the nonvolatile memory device of FIG. 6.

The operation of the nonvolatile memory cell according to the present invention will now be described in detail. In order to program the memory cell, a voltage of 6~7V is applied to a bit line connected to the drain region 310, a voltage of 10~12V is applied to a word line connected to the control gate 360, and a voltage of 0V is applied to the highly doped source 600 and the semiconductor substrate 300. As a result, a channel is formed on the surface of the semiconductor substrate 300 under the floating gate 340, and current flows to the highly doped source 600 through the formed channel from the drain 310. At this time, hot electrons having high energy are generated in a depletion region of the drain 310. The generated hot electrons partially pass through the first insulating layer 700 in the region in which the drain 310 and the floating gate 340 overlap each other to be injected into the floating gate 340. The hot electrons injected into the floating gate 340 are stored in the floating gate 340, so that the threshold voltage of the memory cell is increased to program the memory cell. Referring to FIG. 7, in which electric field intensity graph (b2) and electric potential graph (a2) in a cell during programming of the memory cell of the present invention are shown, a high electric field is formed in a depletion region of the drain 310. Comparing the graph of FIG. 7 to the graph of the conventional memory device of FIG. 4, the conventional memory device has a source region in which a high electric field is formed, and the memory cell according to the present invention has a drain region in which a high electric field is formed. This is because the lightly doped source 602 is doped with a higher concentration than the lightly doped source (see 502 of FIG. 3) in the conventional memory cell and is shorter than the conventional art, so that the resistance of the lightly doped source 602 is reduced. Also, the difference in resistance between the lightly doped source 602 and the highly doped source 600 is smaller than that of a corresponding region in the conventional art, so that the electric potential gradient across the lightly doped source 602 does not rapidly change. Thus, hot carriers generated in the lightly doped source 602 and the highly doped source 600 are reduced. As a result, according to the nonvolatile memory device of the present invention, the deterioration of the characteristics of the memory device can be suppressed.

In order to erase electrons stored in the floating gate 340 of the nonvolatile memory cell, a positive voltage is applied to the semiconductor substrate 300 and a negative or zero voltage is applied to the control gate 360. Thus, the electrons stored in the floating gate 340 are F-N tunneled through the first insulating layer 700 and move to the semiconductor substrate 300. The erase operation is compared to the erase operation of the memory cell having the conventional lightly doped source (see 502 of FIG. 3). That is, according to the erase operation of the present memory cell, electrons are tunneled to the semiconductor substrate 300, hence the highly doped source 600 is not required to be overlapped by the floating gate 340. Thus, unlike the conventional nonvolatile memory device (see 320 of FIG. 1), the highly doped source 600 is not formed on the surface of the semiconductor substrate 300 under the floating gate 340, so that the length of the floating gate 340 can be reduced. As a result, the integration of the memory cell can be enhanced. Also, the electrons are not tunneled to the highly doped source 600, so that the phenomenon of trapped electrons in the first insulating layer 700 formed between the lightly doped source 602 and the floating gate 340 is reduced. Also, the electrons trapped in the first insulating layer 700 between the drain 310 and the floating gate 340 during program operation can be discharged from the first insulating layer 700 by an electric field formed during the erase operation. According to the nonvolatile memory cell of the present invention the electrons stored in the floating gate 340 are moved to the semiconductor substrate 300, so that the operation of the memory cell can be more stably realized than the conventional memory cell in which the electrons are erased to the source. Also, the lightly doped source 602 and the highly doped source 600 are shallower than the depth of the drain 310, so that areas of the lightly doped source 602 and the highly doped source 600 are reduced to enhance the integration of the memory cell.

Embodiment of a Method for Manufacturing a Nonvolatile Memory Cell

Figure 8A:
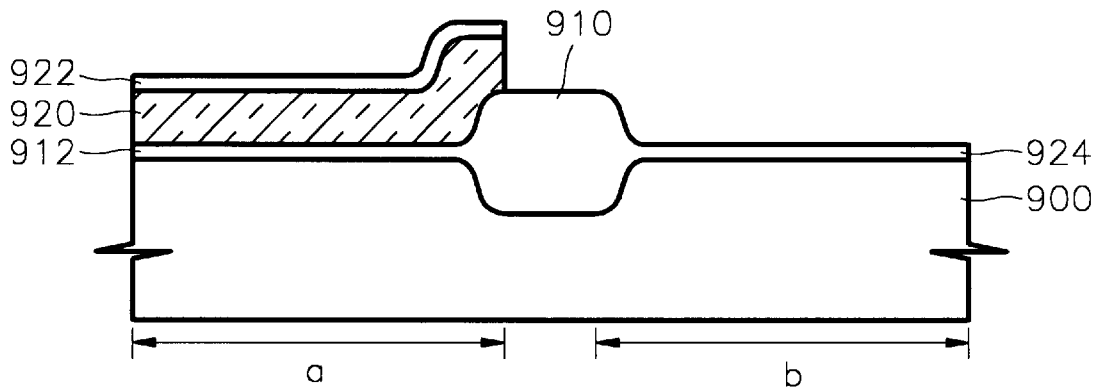
FIGS. 8A through 8F are sectional views sequentially showing a method for manufacturing the nonvolatile memory device of FIG. 6.

Referring to FIG. 8A, an isolation region 910 is formed on a semiconductor substrate 900 by a LOCal Oxidation of Silicon process. A first insulating layer 912 is formed on the entire surface of the semiconductor substrate 900 where the isolation region 910 is formed. Preferably, the first insulating layer 912 is a tunnel oxide layer capable of tunneling electrons, and has a thickness of 70~100 Å. Polysilicon is deposited on the semiconductor substrate 900 where the first insulating layer 912 is formed, and then an impurity, e.g., $POCl_3$ is doped and patterned to form a floating gate layer 920. Then, a second insulating layer 922 having the structure of oxide/nitride/oxide (ONO) is formed on the floating gate layer 920. Preferably, the second insulating layer 922 has a thickness of 140~200 Å. The floating gate 920 and the second insulating layer 922 are formed not in the peripheral circuit region (region b of FIG. 8A) but in the memory cell region (region a of FIG. 8A). Then, a gate insulating layer 924 is formed in the peripheral circuit region.

Figure 8B:
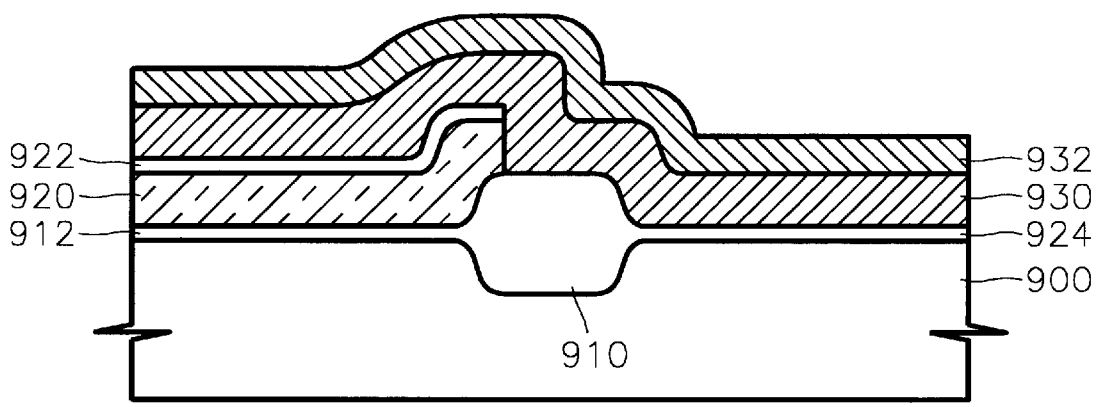

Referring to FIG. 8B, polysilicon is deposited on the entire surface of the semiconductor substrate 900 where the gate insulating layer 924 is formed, and then an impurity, e.g., $POCl_3$ is doped to form a control gate layer 930. Then, in order to reduce resistance of the control gate layer 930, preferably, silicide (not shown) such as tungsten silicide, titanium silicide or tantalum silicide is formed on the control gate layer 930. Then, it is preferable to form a protective layer 932 for protecting the control gate layer 930 and the silicide from a later process. It is also preferable that the protective layer 932 is formed of an oxide layer, a nitride layer or a structure in which the oxide layer and the nitride layer are stacked, to a thickness of approximately 2,000 Å.

Figure 8C:
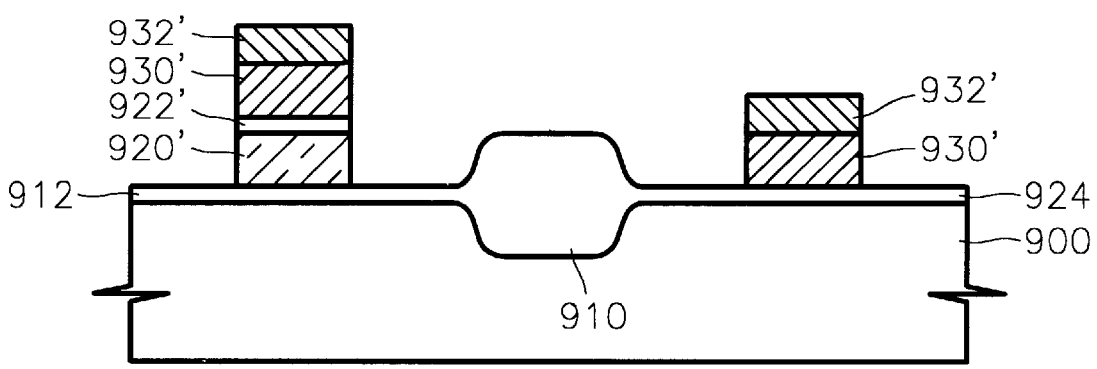

Referring to FIG. 8C, the floating gate layer 920, the second insulating layer 922, the control gate layer 930 and the protective layer 932 are patterned, to thereby form the gate structure of a gate in which the floating gate 920', the second insulating layer pattern 922', the control gate 930' and a protective layer pattern 932' are stacked, in the memory cell region a. Also, a gate for a MOS transistor comprising the control gate 930' and the protective layer pattern 932' is formed in the peripheral circuit region b.

Figure 8D:
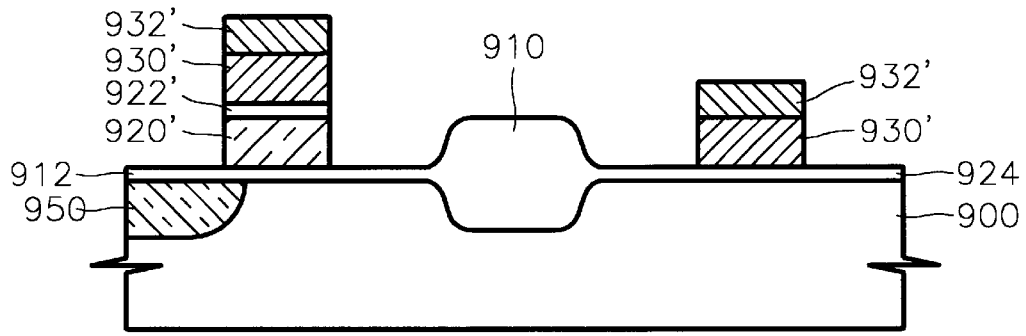

Referring to FIG. 8D, a drain region 950 of the memory cell region a is defined by ion-implanting an n-type impurity, e.g., As or P. Here, preferably, the ion implantation dose of the impurity is $2 \times 10^{15} \sim 6 \times 10^{15}$ ions/cm$^2$. After implanting the impurity, an oxide layer with a thickness (not shown) of 100~300 Å is grown on the entire surface of the semiconductor substrate 900, and the grown oxide layer is annealed to diffuse the implanted impurity.

Figure 8E:
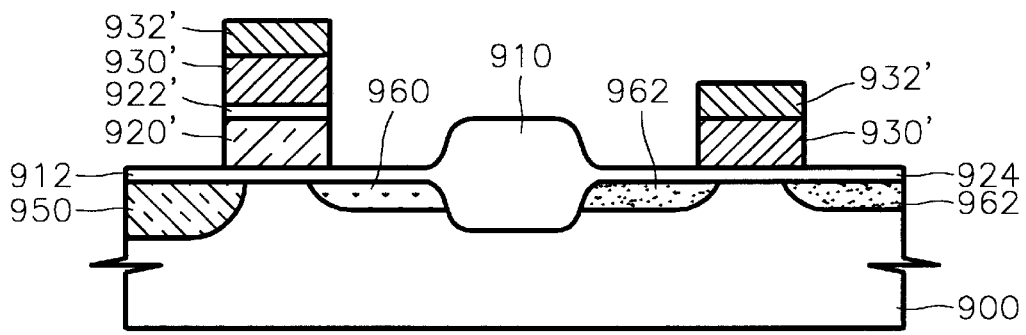

Referring to FIG. 8E, a source region of the memory cell 960 is defined by ion-implanting an n-type impurity. Here, preferably, the ion implantation dose of the impurity is $3 \times 10^{13} \sim 6 \times 10^{13}$ ions/cm$^2$. Then, the n-type impurity is implanted into the entire surface of the semiconductor substrate 900 at a dose of $1 \times 10^{13} \sim 3 \times 10^{13}$ ions/cm$^2$, to form a lightly doped source and drain 962 in the peripheral circuit region b, and increase the impurity concentration of the lightly doped source 960 formed in the memory cell a. Thus, the impurity dose of the lightly doped source 960 formed in the memory cell is higher than that of the lightly doped source and drain 962 of the MOS transistor formed in the peripheral circuit region.

Figure 8F:
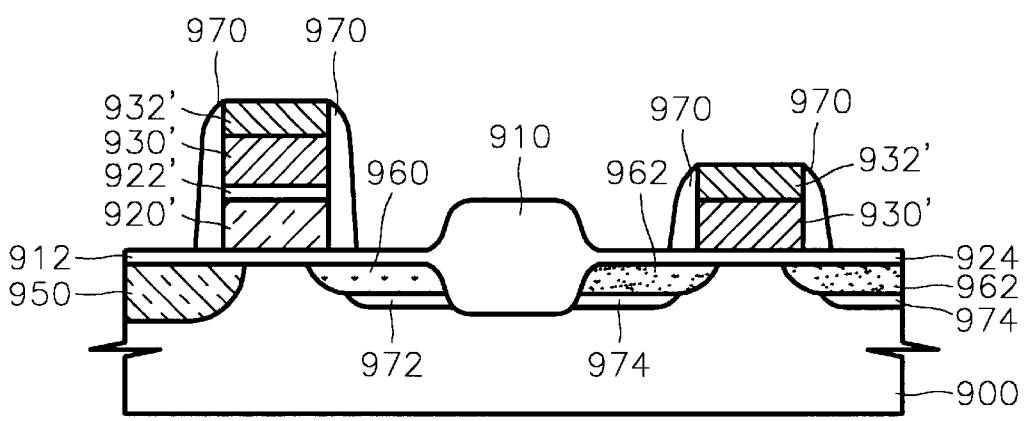

Referring to FIG. 8F, an oxide layer or a nitride layer is deposited on the entire surface of the semiconductor substrate 900 with a thickness of 1,000~1,500 Å, and dry-etched to form a spacer 970. Then, the drain 950 which is formed in the memory cell region is coated with a photoresist layer pattern (not shown), and n-type impurity is implanted to a dose of $2 \times 10^{15} \sim 6 \times 10^{15}$ ions/cm$^2$ using the protective layer 932', the spacer 970 and the photoresist layer pattern as a mask. As a result, the highly doped source 972 is formed in the memory cell region, and the highly doped source and drain 974 are formed in the peripheral circuit region. Here, preferably, the highly doped source 972 of the memory cell region and the highly doped source and drain 974 of the peripheral circuit region are shallower than the drain 950 of the memory cell.

As described above, in the nonvolatile memory cell formed by a manufacturing method of the present invention, the depth of the highly doped source is reduced, and the floating gate and the highly doped source are not overlapped, to thereby enhance the integration of the memory cell. Also, the electrons stored in the floating gate during the erase operation of the memory cell are tunneled to the semiconductor substrate, so that electron trapping in the insulating layer formed between the lightly doped source and the floating gate is reduced, to thereby obtain stable operation characteristics of the device.

What is claimed is:

1. A nonvolatile memory device comprising:
    a semiconductor substrate of a first conductivity type;
    a first insulating layer, a floating gate, a second insulating layer and a control gate sequentially stacked on the semiconductor substrate;
    a highly doped source of a second conductivity type formed around a surface of the semiconductor substrate, spaced away from a sidewall of the floating gate;
    a lightly doped source of the second conductivity type formed around the surface of the semiconductor substrate, wherein the lightly doped source is connected to the highly doped source and is overlapped by the floating gate, and the lightly doped source has an impurity concentration lower than that of the highly doped source; and
    a drain of the second conductivity type formed around the surface of the semiconductor substrate, wherein the drain of the second conductivity type is overlapped by the floating gate and is deeper than the highly doped source, the drain of the second conductivity type having an impurity concentration the same as that of the highly doped source.

2. The nonvolatile memory device of claim 1, wherein the lightly doped source has an impurity concentration of $5 \times 10^{17} \sim 5 \times 10^{18}$ atoms/cm$^3$.

3. The nonvolatile memory device of claim 1, wherein the lightly doped source has a length of 0.2 µm or less in the direction of the floating gate from an edge of the highly doped source.

4. The nonvolatile memory device of claim 1, wherein a programming operation of the nonvolatile memory device is performed by generating hot carriers in a depletion region of the drain, when a voltage is applied to the drain and the control gate, and injecting part of the generated hot carriers into the floating gate from a region where the drain region and the floating gate overlap with each other so that the hot carriers are stored in the floating gate.

5. The nonvolatile memory device of claim 4, wherein erase operation of the nonvolatile memory device is performed by tunneling the electrons stored in the floating gate by the program operation into the semiconductor substrate, when a voltage is applied to the semiconductor substrate.

6. A nonvolatile memory device having a cell region and a peripheral circuit region formed on a semiconductor substrate of a first conductivity type, comprising:
    a first insulating layer, a floating gate, a second insulating layer and a control gate which are sequentially formed on the semiconductor substrate of the cell region;
    a highly doped source of a second conductivity type formed around the cell region surface of the semiconductor substrate, and spaced apart from the side wall of the floating gate;
    a lightly doped source of the second conductivity type formed around the cell region surface of the semiconductor substrate, wherein the lightly doped source is connected to the highly doped source and is overlapped by the floating gate, the lightly doped source having an impurity concentration lower than that of the highly doped source;
    a drain of the second conductivity type formed around the cell region surface of the semiconductor substrate, wherein the drain of the second conductivity type is overlapped by the floating gate and has the same impurity concentration as that of the highly doped source; and
    an MOS transistor formed in the peripheral circuit region, having the structure of a lightly doped drain,
    wherein the impurity concentration of the lightly doped source in the cell region is higher than that of the lightly doped drain of the MOS transistor in the peripheral circuit region.

7. The nonvolatile memory device of claim 6, wherein the depth of the drain in the cell region is deeper than that of the highly doped source in the cell region.

8. A method for manufacturing a nonvolatile memory device comprising:
    (a) forming a stacked gate where a first insulating layer, a floating gate, a second insulating layer and a control gate are stacked in a cell region of a semiconductor substrate having a cell region and a peripheral circuit region;
    (b) implanting an impurity and diffusing the impurity to form a drain overlapped by part of the stacked gate;
    (c) implanting an impurity with a dose lower than that of the drain to form a lightly doped source overlapped by part of the stacked gate;
    (d) forming a spacer on a sidewall of the stacked gate;
    (e) forming a photoresist layer pattern on the drain;
    (f) performing implantation into the lightly doped source using the stacked gate, the spacer and the photoresist layer pattern as a mask to form a highly doped source connected to the lightly doped source, without being overlapped by the stacked gate, wherein the highly doped source has a depth lower than that of the drain.

9. The method of claim 8, wherein in the implantation of the impurity and diffusing the impurity to form the drain, the implantation is performed with a dose of $2 \times 10^{15} \sim 6 \times 10^{15}$ ions/cm$^2$.

10. The method of claim 8, wherein implanting the impurity with a dose lower than that of the drain to form a lightly doped source comprises:
    forming a photoresist layer pattern exposing the source of the cell region; implanting an impurity using the photoresist layer pattern as a mask; and
    implanting an impurity into the entire surface of the semiconductor substrate after removing the photoresist layer pattern.

11. The method of claim 10, wherein the implanting of an impurity using the photoresist layer pattern as a mask is performed with a dose of $3 \times 10^{13} \sim 6 \times 10^{13}$ ions/cm$^2$.

12. The method of claim 10, wherein the implanting of an impurity into the entire surface of the semiconductor substrate is performed with a dose of $1 \times 10^{13} \sim 3 \times 10^{13}$ ions/cm$^2$.

13. The method of claim 10, wherein the implanting of an impurity into the entire surface of the semiconductor substrate is the step of forming a lightly doped source in the cell region and simultaneously forming a lightly doped source and drain of a MOS transistor on the peripheral circuit region of the semiconductor substrate.

14. The method of claim 13, wherein the lightly doped source and drain of the MOS transistor in the peripheral circuit region of the semiconductor substrate are formed with an impurity concentration lower than that of the lightly doped source of the cell region.

15. The method of claim 8, wherein in the forming of the highly doped source region, the implantation is performed with a dose of $2\times10^{15}$~$6\times10^{15}$ ions/cm$^2$.

16. The method of claim 8, wherein a highly doped source and drain of a MOS transistor are simultaneously formed in the peripheral circuit region of the semiconductor substrate when the highly doped source in the cell region is formed.

17. The method of claim 8, wherein the highly doped source of the cell region and the highly doped source and drain in the peripheral circuit region of the semiconductor substrate is formed to have a depth lower than that of the drain of the cell region.

* * * * *

UNITED STATES PATENT AND TRADEMARK OFFICE
CERTIFICATE OF CORRECTION

PATENT NO. : 6,330,187 B1
DATED : December 11, 2001
INVENTOR(S) : Jeong-hyuk Choi and Jong-han Kim It is certified that error appears in the above-identified patent and that said Letters Patent is hereby corrected as shown below:

Column 10,
Lines 21-67, delete claims 8-13

Column 11, lines 1-10 and Column 12, lines 1-7,
Delete claims 14-17.

Signed and Sealed this

Eighteenth Day of June, 2002

Attest:

JAMES E. ROGAN
Attesting Officer      Director of the United States Patent and Trademark Office

UNITED STATES PATENT AND TRADEMARK OFFICE
CERTIFICATE OF CORRECTION

PATENT NO.         : 6,330,187 B1
APPLICATION NO. : 09/437801
DATED                 : December 11, 2001
INVENTOR(S)       : Jeong-hyuk Choi et al.

It is certified that error appears in the above-identified patent and that said Letters Patent is hereby corrected as shown below:

<u>Title Page,</u>
Item (73), Assignee, delete (JP) and insert therefor (KR).

Signed and Sealed this

Eleventh Day of September, 2007

JON W. DUDAS
*Director of the United States Patent and Trademark Office*